(12) United States Patent
Maeda

(10) Patent No.: US 6,411,128 B2
(45) Date of Patent: Jun. 25, 2002

(54) LOGICAL CIRCUIT FOR SERIALIZING AND OUTPUTTING A PLURALITY OF SIGNAL BITS SIMULTANEOUSLY READ FROM A MEMORY CELL ARRAY OR THE LIKE

(75) Inventor: Kazunori Maeda, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/732,443

(22) Filed: Dec. 7, 2000

(30) Foreign Application Priority Data

Dec. 10, 1999 (JP) .......................................... 11-351501

(51) Int. Cl.[7] ............................ G11C 7/00; H03K 17/62
(52) U.S. Cl. ........................... 326/125; 326/40; 326/46; 326/105; 365/219; 365/220; 365/221
(58) Field of Search ............................ 326/40, 46, 105, 326/125; 327/407; 365/219, 220, 221

(56) References Cited

U.S. PATENT DOCUMENTS 5,714,904 A * 2/1998 Jeong ......................... 327/407
6,038,185 A * 3/2000 Ng et al. ..................... 365/221
6,067,267 A * 5/2000 Lo ............................. 365/221

* cited by examiner

*Primary Examiner*—Michael Tokar
*Assistant Examiner*—Vibol Tan
(74) *Attorney, Agent, or Firm*—Hayes Soloway P.C.

(57) ABSTRACT

Even input bit lines, a first latch circuit group and a second latch circuit group are provided in a logical circuit. The first latch circuit group has a plurality of latch circuits which simultaneously latch a plurality of signal bits propagating the even input bit lines, respectively, in a first timing. The second latch circuit group has a plurality of latch circuits which simultaneously latch a plurality of signal bits propagating the even input bit lines, respectively, in a second timing. The output ends of a plurality of latch circuits are wired-OR to a first node, the plurality of latch circuits latching signal bits which propagate one half of the even input hit lines. The output ends of a plurality of latch circuits are wired-OR to a second node, the plurality of latch circuits latching signal bits which propagate remaining one half of the even input bit lines. The first and the second nodes, are wired-OR to a third node.

12 Claims, 7 Drawing Sheets

LOGICAL CIRCUIT FOR SERIALIZING AND OUTPUTTING A PLURALITY OF SIGNAL BITS SIMULTANEOUSLY READ FROM A MEMORY CELL ARRAY OR THE LIKE

BACKGROUND OF THE INVENTION

1. Field of the Invention

The present invention relates to a logical circuit for serializing and outputting a plurality of signal bits simultaneously read from a memory cell array or the like, and in particular, a logical circuit with the timing margin of control signals required for the operation control expanded.

2. Description of the Related Art

There is a method for simultaneously specifying a plurality of addresses of a memory cell on the basis of one input address. There is a memory specification, called burst length, in which an address to be selected next is determined on the basis of an input address, and the above-described specifying method is enabled by the burst length. From data stored in a plurality of addresses simultaneously specified, data bits are burst-output in serial. In addition, by the CAS latency standard, the time period front an address input to a start of data bit output to the outside is specified.

FIG. 1 is a block diagram showing the configuration of a conventional logical circuit. This conventional logical circuit is a circuit to which 4-bit signals (burst length: 4) simultaneously addressed from a memory cell array are input in parallel and from which they are burst-output in serial.

As shown in FIG. 1, four input bit lines BL1 through BL4 connected to the memory cell array are provided to the conventional logical circuit. Latch circuits L1 and L5 are connected to the input bit line BL1, latch circuits L2 and L6 are connected to the input bit line BL2, latch circuits L3 and L7 are connected to the input bit line BL3, and latch circuits L4 and L8 are connected to the input bit line BL4. A first latch circuit group is composed of the latch circuits L1 through L4 and a second latch circuit group is composed of the latch circuits L5 through L8.

Switches SW1 and SW5 are respectively provided between the input ends of the latch circuits L1 and L5 and their common connection point. Switches SW1 and SW5 are controlled by control signals $t_1$ and $t_2$, respectively. Switches SW3 and SW7 are respectively provided between the input ends of the latch circuits L3 and L7 and their common connection point. Switches SW3 and SW7 are controlled by the control signals $t_1$ and $t_2$, respectively Switches SW2 and SW6 are provided respectively between the input ends of the latch circuits L2 and L6 and their common connection point. Switches SW2 and SW6 are controlled by the control signals $t_1$ and $t_2$, respectively. In addition, Switches SW4 and SW8 are respectively provided between the input ends of the latch circuits L4 and L8 and their common connection point. Switches SW4 and SW8 are controlled by the control signals $t_1$ and $t_2$, respectively.

The output ends of the latch circuits L1 through L8 are connected in common to a node N1, and switches SW11 through SW18 are respectively connected between the node N1 and output ends of the latch circuits L1 through L8. The switches SW11 through SW18 are controlled by control signals $t_A$ through $t_H$, respectively.

In addition, there is provided an output circuit 101 to which the node N1 is connected. In the output circuit 101, a switch SW21 one end of which is connected to the node N1 is provided. The switch SW21 is controlled by a control signal $t_Z$. The other end of the switch SW21 is connected to the output terminal OUT.

Explanation will be given of operation of the conventional logical circuit configured as described above. FIG. 2 is a timing chart that shows the operation of the conventional logical circuit.

The conventional logical circuit operates in synchronism with an external clock CLK. One cycle of the external clock CLK is, for example, 10 nsec. The CAS latency (CL) is 2, in which, after 2 clocks from input of the address in the memory cell array, data bit stored in the address is output.

When 4-bit data are read out simultaneously from the memory, the 4-bit data are propagated in parallel to input bit lines BL1 through BL4. These data bits are denoted by $D_1$, $D_2$, $D_3$, and $D_4$. Also data bits successively read out thereafter are denoted by $D_5, D_6, D_7, D_8, \ldots D_n$. Then, the control signal $t_1$ rises and the switches SW1 through SW4 are turned on. As a result, to the latch circuits L1 through L4, which composes the first latch circuit group, the data bits $D_1$ through $D_4$ are latched, respectively.

Thereafter, the control signals $t_2$ and $t_1$ rise alternately every 1 clock and the data bits $D_5$ through $D_8$ are latched to the latch circuits L5 through L8, which composes the second latch circuit group, respectively, and the data bits $D_9$ through $D_{12}$ are latched to the latch circuits L1 through L4, respectively, and the data read out from the memory cell array are alternately latched to the latch circuit groups alternately by 4 bits.

In the meantime, on the output side of the latch circuits L1 through L8, the control signals $t_A$, $t_B$, $t_C$, $t_D$, $t_E$, $t_F$, $t_G$ and $t_H$ rise successively every ¼ clock of the external clock CLK. The control signal $t_Z$ becomes active in synchronism with rising of all the control signals $t_A$ through $t_H$. It should be noted that the control signal $t_A$ becomes active more than 1 clock faster than the data bits $D_9$ is latched. If the control signal $t_A$ becomes active in timing slower than that timing, data will be destroyed because at least the data bits $D_4$ is not output in timing when the data bits $D_9$ through $D_{12}$ are latched.

In this way, 4-bit data simultaneously read out from the memory cell array are serialized and output.

However, since in the above-mentioned conventional logical circuit, the control signal $t_Z$ becomes active in synchronism with rising of all the control signals $t_A$ through $t_H$, the length of one cycle of the control signal $t_Z$ is ¼ times as much as the length of one cycle of the external clock CLK, as shown in FIG. 2. If the length of one cycle of the external clock CLK is 10 nsec., the length of one cycle of the control signal $t_Z$ is 2.5 nsec., which is extremely short. If the duty ratio is 50%, the activation and deactivation controls must be carried out every 1.25 nsec. Consequently) the timing margin is extremely narrow, causing a problem of difficult control. With respect to the control signals $t_A$ through $t_H$, it is not as much as the control signal $t_Z$, but activation and deactivation controls must be carried out every 2.5 nsec., and the timing margin is also narrow.

As described above, in order to simultaneously read out, serialize, and output a plurality of data bits, at least the same number of latch circuits to latching the data as the number of the data bits simultaneously read out is required. When the output of data bit is delayed by the CAS latency standard or a long data retention period is unable to be set, a data bit already latched is destroyed it a next new data bits arrives from the memory cell array before all the data are output from the latch circuits. To prevent this, the number of latch circuits may be increased, but since the longer the burst length or the higher the operation speed, the more increased is the number of simultaneous readouts from the memory cell array, and consequently, the increase of latch circuits as a result of this will become extremely larger and it is not desirable from the viewpoint of space saving, reduced cost and the like. Consequently, all the latched data must be output before new data arrives from the memory cell array by the use of the control signal $t_Z$, which operates at a high speed. However, as described above, there is a problem, in that timing margin of the control signal $t_Z$ is extremely narrow and it is difficult to control its activation and deactivation.

SUMMARY OF THE INVENTION

It is an object of the present invention to provide a logical circuit that can secure wide timing margin for control signals even under the high-speed operation and that can improve the operation accuracy.

A logical circuit according to the present invention comprises even input bit lines, a first latch circuit group and a second latch circuit group are provided. The first latch circuit group comprises a plurality of latch circuits which simultaneously latch a plurality of signal bits propagating the even input bit lines, respectively, in a first timing. The second latch circuit group comprises a plurality of latch circuits which simultaneously latch A plurality of signal bits propagating the even input bit lines, respectively, in a second timing. The output ends of a plurality of latch circuits are wired-OR to a first node, the plurality of latch circuits latching signal bits which propagate one half of the even input bit lines. The output ends of a plurality of latch circuits are wired-OR to a second node, the plurality of latch circuits latching signal bits which propagate remaining one half of the even input bit lines. The first and the second nodes are wired-OR to a third node. The logical circuit further comprises a first control system and second control system. The first control system successively outputs signal bits latched to one latch circuit group of the first and second latch circuit groups to the first node and then successively outputs signal bits latched to the other latch circuit group to the second node before latching the next signal bits. The second control system alternately outputs signal bits successively inputted to the first and second nodes from the first and second nodes to the third node.

In the present invention, the output ends of a plurality of latch circuits are connected to the first and second nodes half-and-half, and signal bits successively input to the first and second nodes are alternately output from both nodes to the third node by the second control system. As a result, the signal bits latched to a plurality of the latch circuits are serialized and output from the third node. In such event, because the second control system is only required to alternately switch the connection between the first and second nodes and the third node, a control signal for the switching is not required to rise every time the signal bit is output. Consequently, a wide timing margin of the control signal can be secured. In addition, even when a latch circuit whose output end is connected to the first node and a latch circuit whose output end is connected to the second node become connecting simultaneously to each node, the data latched to both latch circuits is not output from the third node by the second control system. Therefore, in the first control system, a wide timing margin for a control signal can be secured.

DETAILED DESCRIPTION OF THE PREFERRED EMBODIMENT

Figure 3:
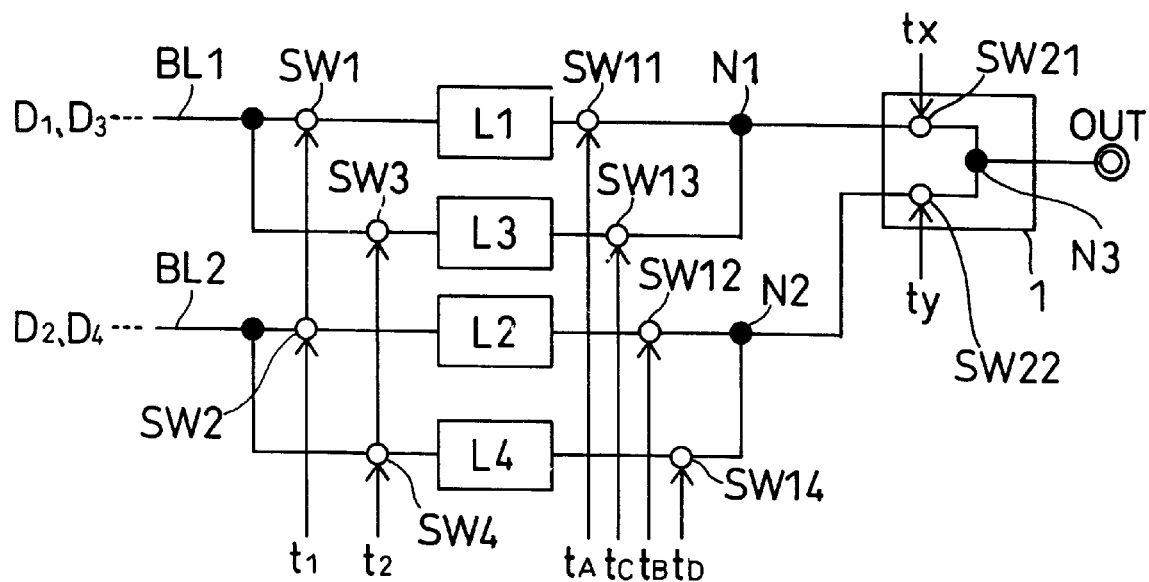
FIG. 3 is a block diagram showing a configuration of logical circuit according to a first embodiment of the present invention.

Referring to the drawings, preferred embodiments according to the present invention will be described specifically as follows. A first embodiment is a circuit for inputting 2-bit signal (burst length: 2) simultaneously addressed in parallel from a memory cell array and burst-outputting the signal in serial. FIG. 3 is a block diagram showing the configuration of the logical circuit according to the first embodiment of the present invention.

As shown in FIG. 3, to the first embodiment, two input bit lines BL1 and BL2 connected to a memory cell array are provided. Latch circuits L1 and L3 are connected to the input bit line BL1, and latch circuits L2 and L4 are connected to the input bit line BL2. A first latch circuit group may be composed of the latch circuits L1 and L2, and a second latch circuit group may be composed of the latch circuits L3 and L4. Each of the latch circuits may comprise two inverters, for example, one output of which is connected to the other input and the other output of which is connected to the one input, but the present invention should not be limited to this kind of configuration.

Switches SW1 and SW3 are respectively connected between the input ends of the latch circuits L1 and L3 and their common connection point. The switches SW1 and SW3 are controlled by control signals $t_1$ and $t_2$, respectively. The output ends of the latch circuits L1 and L3 are wired-OR to a first node N1. Switches SW11 and SW13 are respectively connected between the node N1 and the output ends of the latch circuits L1 and L3. The switches SW11 and SW13 are controlled by control signals $t_A$ and $t_C$, respectively.

Switches SW2 and SW4 are respectively connected between the input ends of the latch circuits L2 and L4 and their common connection point. The switches SW2 and SW4 are controlled by the control signals $t_1$ and $t_2$, respectively. The output ends of the latch circuits L2 and L4 are wired-OR to a second node N2. Switches SW12 and SW14 are respectively connected between the node N2 and the output ends of the latch circuits L2 and L4. The switches SW12 and SW14 are controlled by control signals $t_B$ and $t_D$, respectively. The cycle of the control signals $t_1$ and $t_2$ corresponds to two clocks of the external clock CLK.

In addition, there is provided an output circuit 1 to which the nodes N1 and N2 are connected. In the output circuit 1, the nodes N1 and N2 are wired-OR to a third node N3, and switches SW21 and SW22 are respectively connected between the node N3 and the nodes N1 and N2. The switches SW21 and SW22 are controlled by control signals $t_x$ and $t_y$, respectively. The node N3 is connected to the output terminal OUT. The length of one cycle of the control signals $t_x$ and $t_y$ corresponds to one clock of the external clock CLK. Consequently, when 1 clock of the external clock CLK is 10 nsec, the length of one cycle of the control signals $t_x$ and $t_y$ is 10 nsec., too, Consequently, if the duty ratio of the control signals $t_x$ and $t_y$ is 50%, activation and deactivation may be controlled every 5 nsec. Each switch may be composed of, for example, a P-channel transistor.

Figure 4:
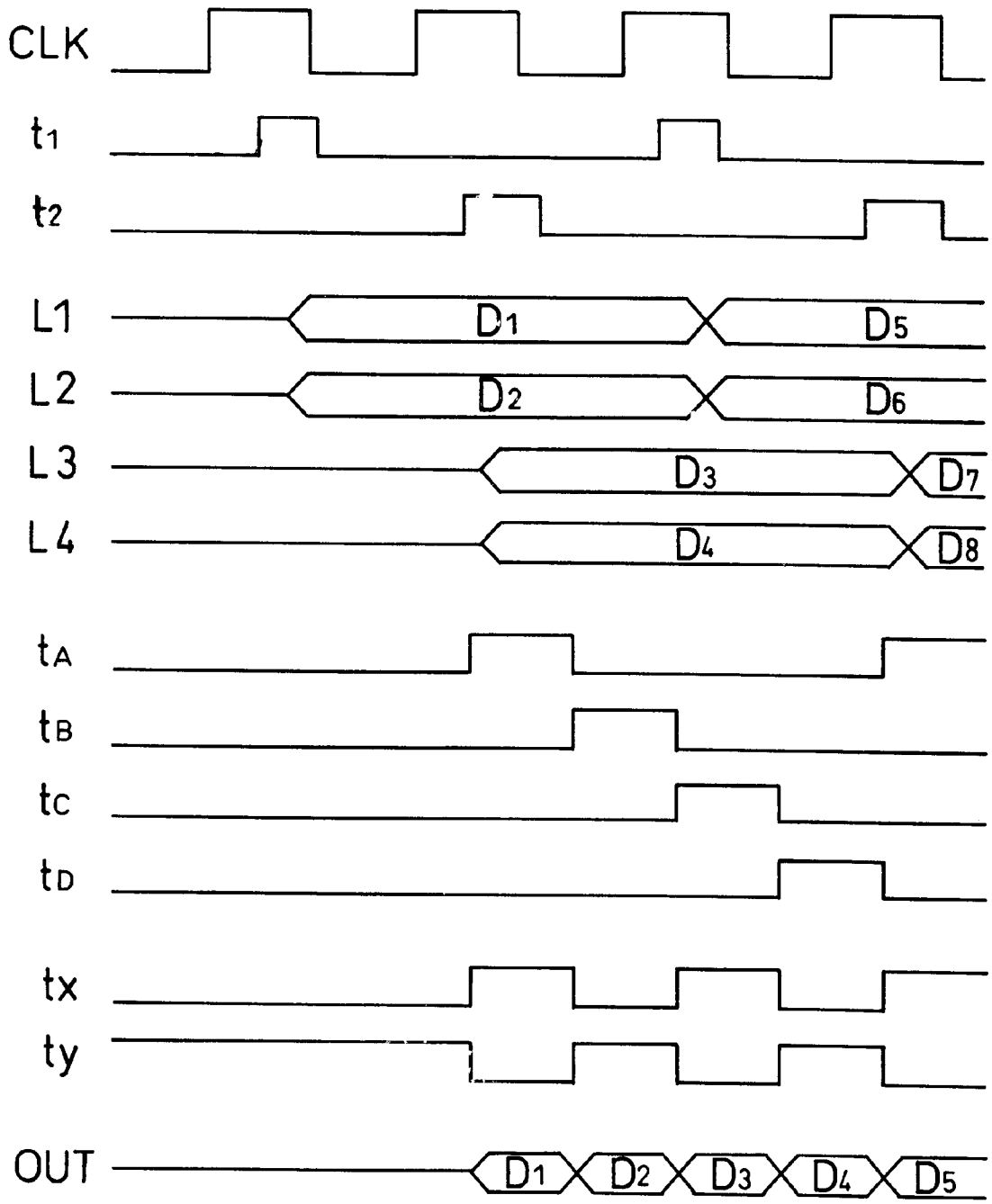
FIG. 4 is a timing chart showing operation of the logical circuit according to the first embodiment of the present invention.

Next description will be made on operation of the first embodiment configured as described above. FIG. 4 is a timing chart showing the operation of the logical circuit according to the first embodiment of the present invention.

The logical circuit according to the first embodiment operates in synchronization with the external clock CLK. One cycle of the external clock CLK is, for example, 10 nsec. The CAS latency (CL) is, for example, 2, and data-bits are output after 2 clocks from input of the address to the memory cell array.

When 2-bit signal bits (data) are read out simultaneously from the memory cell array, the 2-bit data are propagated in parallel in the input bit lines BL1 and BL2. Now, these data bits are denoted by $D_1$ and $D_2$. Also data bits successively read out thereafter are denoted by $D_3$, $D_4$, $D_5$, $D_6$, ... $D_n$. Then, the control signal $t_1$ rises and the switches SW1 through SW2 are turned on. As a result, the data $D_1$ and $D_2$ are latched to the latch circuits L1 and L2, respectively, which composes the first latch circuit group.

Thereafter, the control signals $t_2$ and $t_1$ rise alternately every 1 clock and the data $D_3$ and $D_4$ are latched to the latch circuits L3 and L4, respectively, which composes the second latch circuit group, and the data $D_5$ and $D_6$ are latched to the latch circuits L1 and L2, respectively, and the data read out from the memory cell array are alternately latched to the latch circuit groups alternately by 2 bits each.

In the meantime, on the output side of the latch circuits L1 through L4, the control signals $t_A$, $t_B$, $t_C$, and $t_D$ rise successively every ½ clock of the external clock CLK. The control signal $t_x$ becomes active in the same timing as that of the control signals $t_A$ and $t_C$ and the control signal $t_y$ becomes active in the same timing as that of the control signals $t_B$ and $t_D$.

In this way, according to the present embodiment, even when the length of one cycle of the control signals $t_x$ and $t_y$ is brought to correspond to 1 clock of the external clock CLK, 2-bit data input in parallel can be output successively in serial. Consequently, activation and deactivation control of the control signals $t_x$ and $t_y$ becomes easy and a wide margin is able to be secured. For example, if one clock is 10 nsec, activation and deactivation control of the control signals $t_x$ and $t_y$ can be made every 5 nsec.

Figure 1:
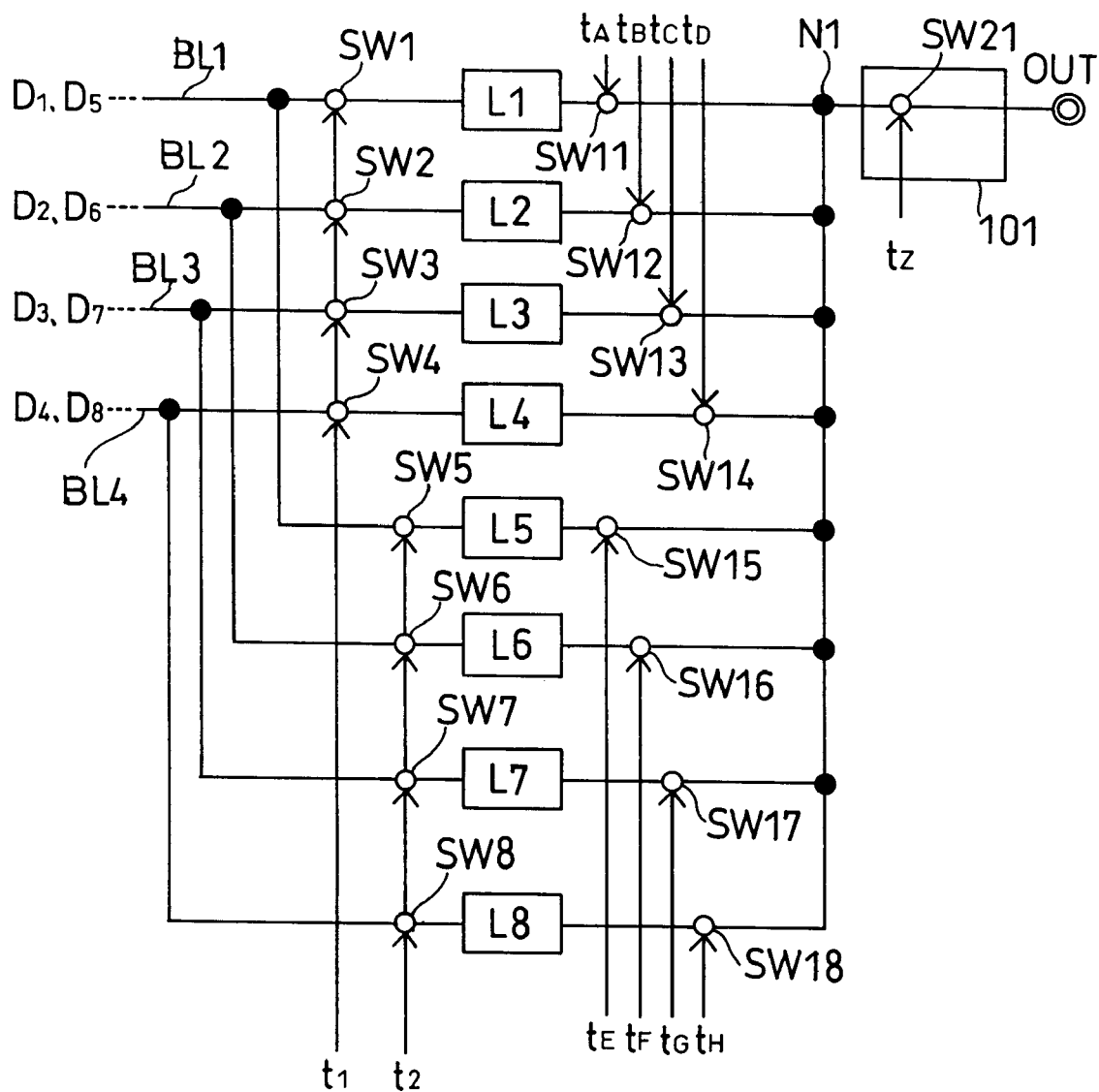
FIG. 1 is a block diagram that shows a configuration of a conventional logical circuit.
Figure 2:
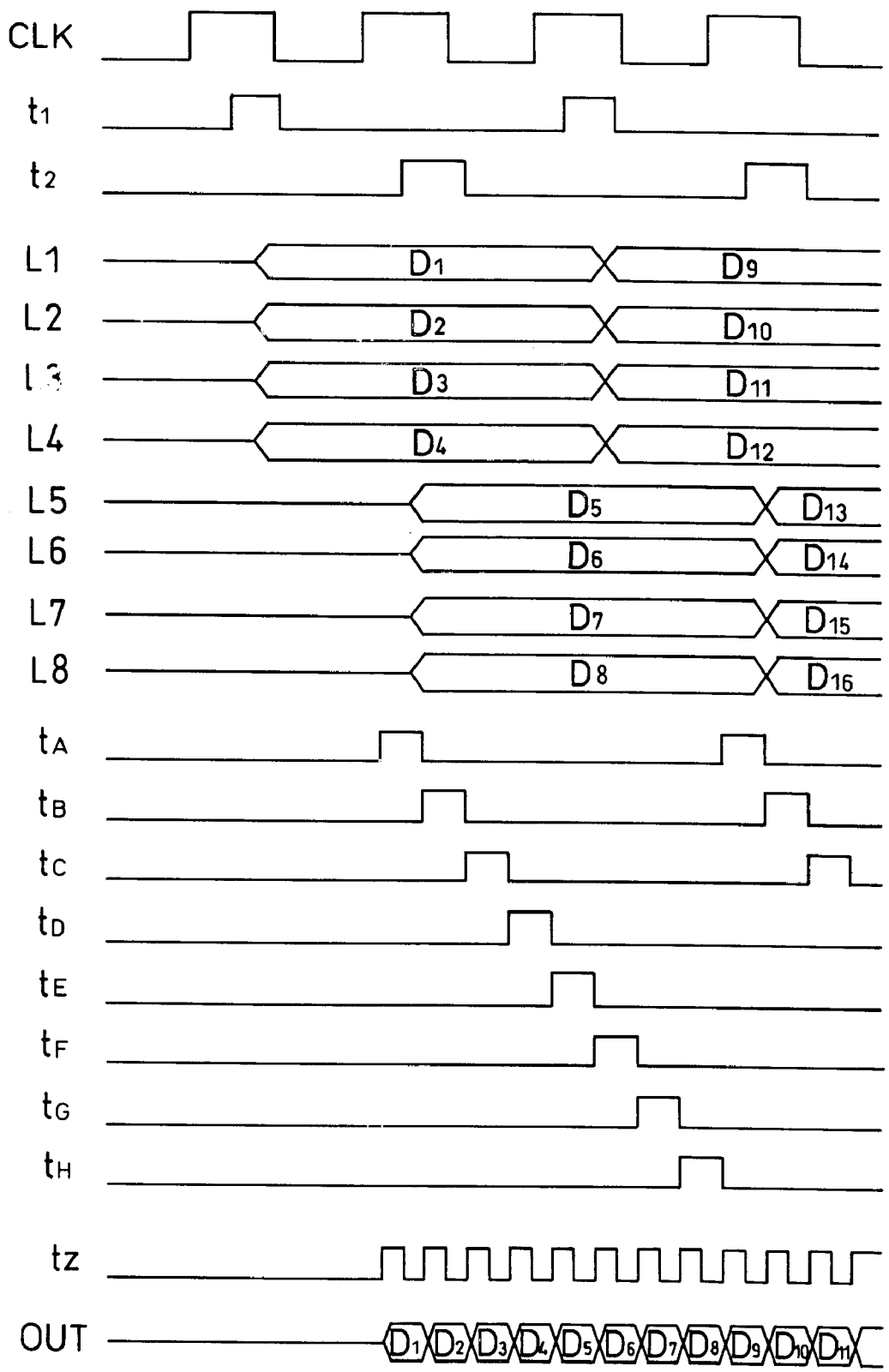
FIG. 2 is a timing chart showing operation of the conventional logical circuit.

In the operation shown in FIG. 2, the period during which the control signals $t_A$, $t_B$, $t_C$, and $t_D$ are held high is ½ clock, but the period may be set to one clock and the duty ratio may be 50%. That is because even if, for example, both the control signals $t_A$ and $t_B$ are high, the control signals $t_x$ and $t_y$ are exclusively switched, and the output ends of the latch circuits L1 and L2 will not become connecting simultaneously to the output terminal OUT. By bringing the duty ratio of control signals $t_A$, $t_B$, $t_C$, and $t_D$ to 50% in this way, these activation and deactivation margins can be further widened. For example, if 1 clock is 10 nsec, activation and deactivation control of control signals $t_A$, $t_B$, $t_C$, and $t_D$ can be made every 10 nsec.

In the first embodiment, the period during which the data are latched to the latch circuits L1 through L4 is set to about 2 clocks of the external clock CLK and the four latch circuits are provided, bat when the period during which the data are latched is set longer, more latch circuits are required. That is because entering the next data with the already latched data not output destroys the latched data by the collision.

Figure 5:
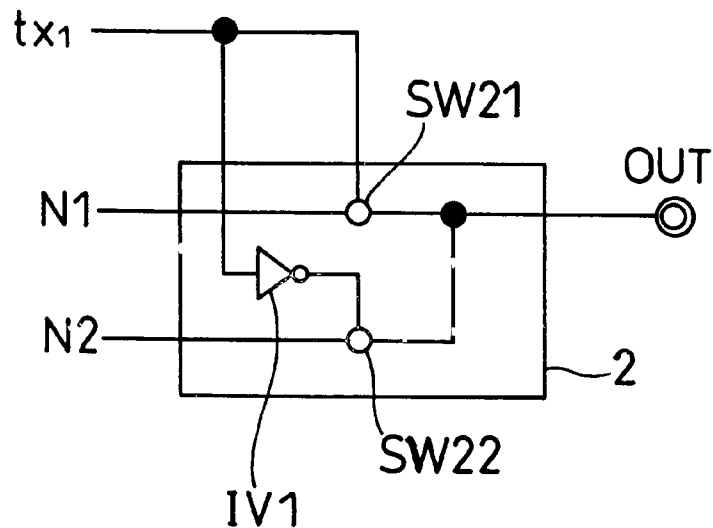
FIG. 5 is a circuit diagram showing a modified example of an output circuit.

In the first embodiment, the control signals $t_x$ and $t_y$ are different signals from each other, but these may be generated with one signal. FIG. 5 is a circuit diagram showing a modified example of the output circuit. To the, output circuit 2 of the modified example, an inverter IV1 is provided and the switch SW21 may be controlled by a control signal $t_{x1}$ that varies in the same manner as the control signal $t_x$, while the switch SW22 may be controlled by a control signal generated by the control signal $t_{x1}$ inverted by the inverter IV1. Even if the output circuit 2 configured in this way is used, an operation same as that of the above-mentioned embodiment may be carried out.

Figure 6:
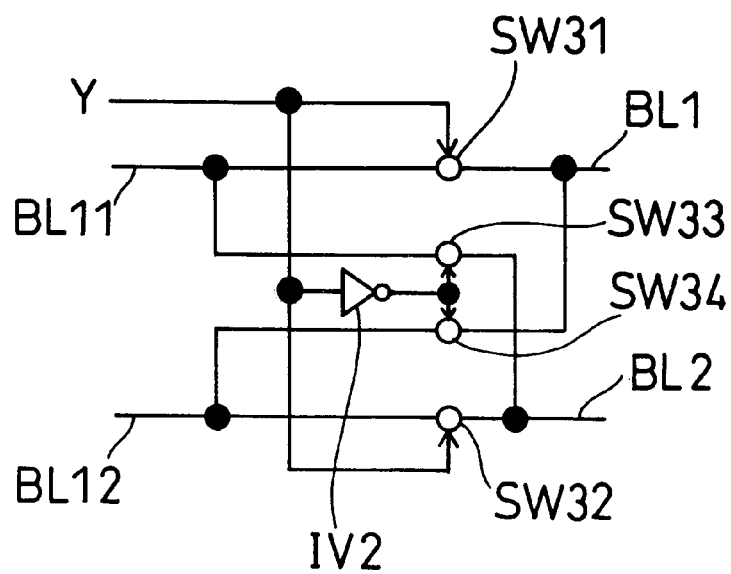
FIG. 6 is a circuit diagram showing an example of the multiplexer.

Between the memory cell array and the logical circuit according to the first embodiment, a multiplexer may be provided for selecting which input bit line BL1 or BL2 should be used for carrying the data read out. The multiplexer is used for changing over between sequential readout and interleave-readout as shown in Table 1 through 3 described later. FIG. 6 is a circuit diagram showing an example of the multiplexer. To the input bit lines BL1 and BL2, two output bit lines BL11 and BL12 from the memory cell array are connected via switches SW31 and SW32, respectively, The output bit lines BL11 and BL12 are branched before the switches SW31 and SW32, and the head ends of the branched signal lines are connected to the input bit lines BL2 and BL1, respectively. That is, these branched signal lines intersect each other. And to the two signal lines branched from the output bit lines BL11 and BL12, switches SW33 and SW34 are respectively provided. The switches SW31 through SW34 may be, for example, transistors that form transfer gates. The switches SW31 and SW32 may be controlled by a control signal Y that corresponds to lower bits containing the LSB (least significant bit) of the first-specified address. On the other hand, the switches SW33 and SW34 may be controlled by a control signal obtained by inverting the control signal Y by an inverter IV2.

In the multiplexer configured in this ways on the basis of the lower bits containing the LSB of the first-specified address of the two bits simultaneously read out, either a pair of the switches SW31 and SW32 or a pair of the switches SW33 and SW34 only are turned on. Consequently, whether signals that propagate the output bit lines BL11 and BL12 get on the input bit lines BL1 and BL2, respectively, as they are, or whether they change their places and get on the input bit lines BL2 and BL1, respectively is selected. That is, from a pair of the latch circuits L1 and L3, and a pair of the latch circuits L2 and L4, one pair to which the data read out should be latched is selected by the multiplexer.

Figure 7:
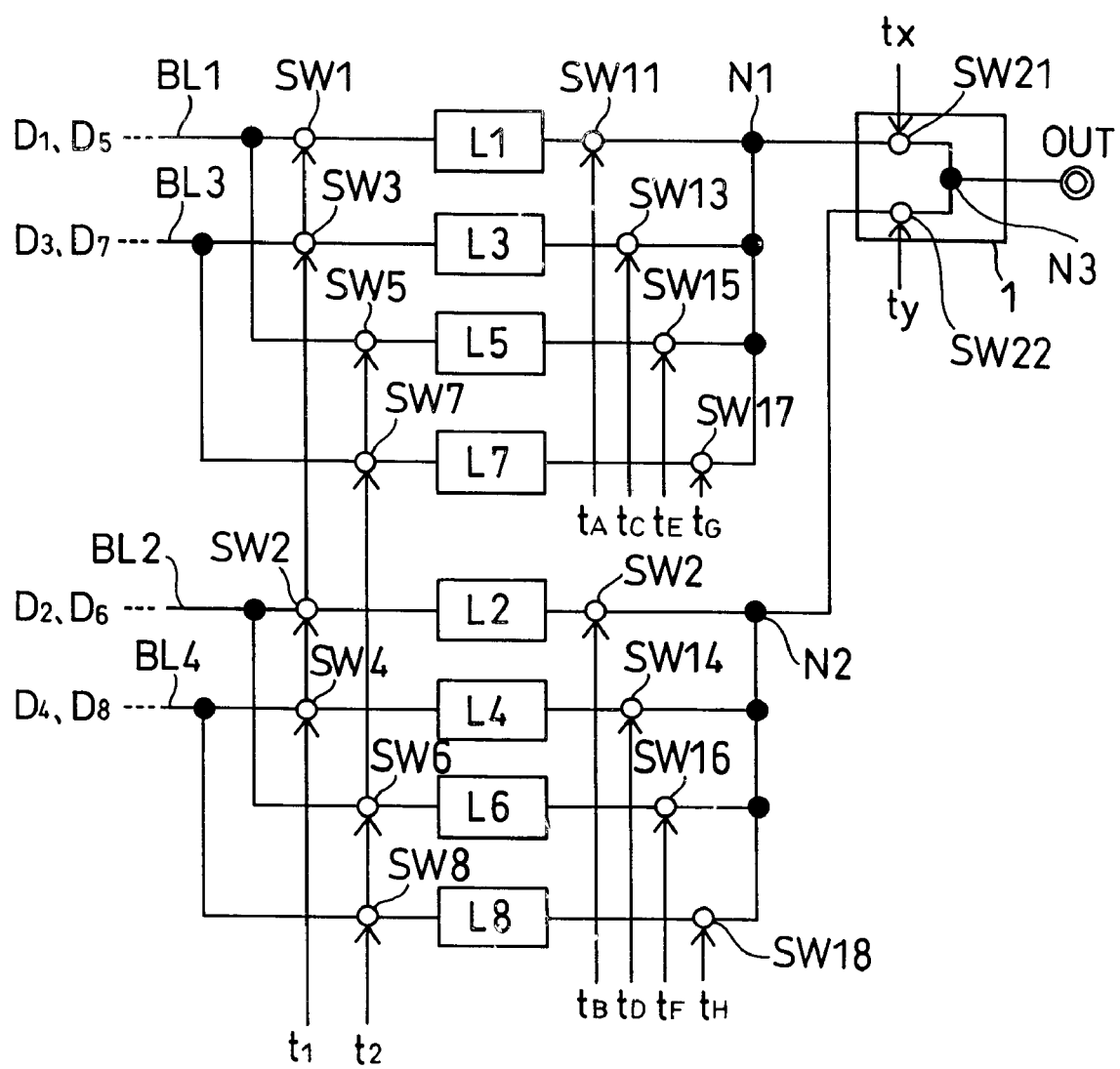
FIG. 7 is a block diagram showing a configuration of logical circuit according to a second embodiment of the present invention.

Description will be made on the second embodiment of the present invention. The second embodiment is a circuit that inputs 4-bit signal (burst length: 4) simultaneously addressed from a memory cell array in parallel and burst-outputs the signal in serial. FIG. 7 is a block diagram showing the configuration of the logical circuit according to the second embodiment of the present invention.

As shown in FIG. 7, in the second embodiment, four input bit lines BL1 through BL4 connected to the memory cell array are provided. Latch circuits L1 and L5 are connected to the input bit line BL1, latch circuits L2 and L6 are connected to the input bit line BL2, latch circuits L3 and L7 are connected to the input bit line BL3, and latch circuits L4 and L8 are connected to the input bit line BL4. A first latch circuit group may be composed of the latch circuits L1 through L4, and a second latch circuit group may be composed of the latch circuits L5 through L8.

Switches SW1 and SW5 are respectively provided between the input ends of the latch circuits L1 and L5 and their common connection point. The switches SW1 and SW5 are controlled by control signals $t_1$ and $t_2$, respectively. Between the input ends of the latch circuits L3 and L7 and their common connection point, switches SW3 and SW7 are provided, respectively. The switches SW3 and SW7 are controlled by the control signals $t_1$ and $t_2$, respectively. Furthermore, the output ends of the latch circuits L1, L3, L5, and L7 are wired-OR to a first node N1, and switches SW11, SW13, SW15, and SW17 are provided between the node N1 and the respective output ends of the latch circuits L1, L3, L5, and L7. The switches SW11, SW13, SW15, and SW17 are controlled by control signals $t_A$, $t_C$, $t_E$, and $t_G$, respectively.

Switches SW2 and SW6 are respectively provided between input ends of the latch circuits L2 and L6 and their common connection point. The switches SW2 and SW6 are controlled by the control signals $t_1$ and $t_2$, respectively. Between input ends of the latch circuits L4 and L8 and their common connection point, switches SW4 and SW8 are provided, respectively. The switches SW4 and SW8 are controlled by the control signals $t_1$ and $t_2$, respectively. In addition, the output ends of the latch circuits L2, L4, L6, and L8 are wired-OR to a second node N2, and between the node N2 and the respective output ends of the latch circuits L2, L4, L6, and L8, switches SW12, SW14, SW16, and SW18 are provided. The switches SW12, SW14, SW16, and SW18 are controlled by control signals $t_B$, $t_D$, $t_F$, and $t_H$, respectively.

Like the first embodiment, there is provided an output circuit 1 to which the nodes N1 and N2 are connected. In the output circuit 1, the nodes N1 and N2 are wired-OR to a third node N3, and switches SW21 and SW22 are provided between the node N3 and the nodes N1 and N2, respectively. The switches SW21 and SW22 are controlled by control signals $t_x$ and $t_y$, respectively. The node N3 is connected to the output terminal OUT.

Each switch may be composed of, for example, a P-channel transistor.

Figure 8:
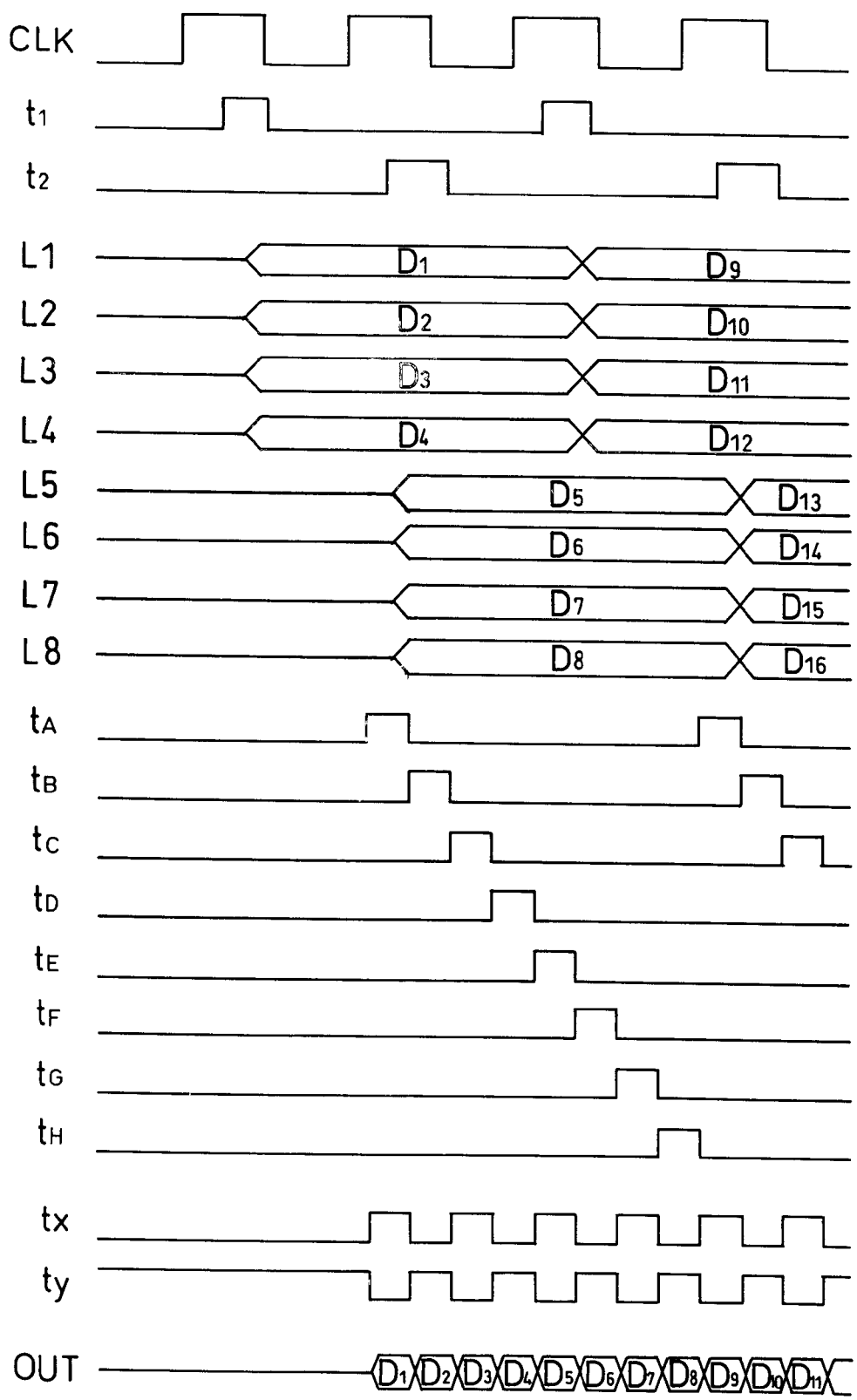
FIG. 8 is a timing chart showing operation of the logical circuit according to the second embodiment of the present invention.

Next explanation will be given of operation of the second embodiment configured as described above. FIG. 8 is a timing chart showing the operation of the logical circuit according to the second embodiment of the present invention.

The logical circuit according to the second embodiment operates in synchronization with the external clock CLK. One cycle of the external clock CLK is, for example, 10 nsec. The CAS latency (CL) is, for example, 2, and data bits are output after 2 clocks from input of the address to the memory cell array.

When 4-bit signal bits (data) are read out simultaneously from the memory cell array, the 4-bit data are propagated in parallel in the input bit lines BL1 through BL4. Now, these data bits are denoted by $D_1$, $D_2$, $D_3$, and $D_4$. Also data bits successively read out thereafter are denoted by $D_5$, $D_6$, $D_7$, $D_8$, ... $D_n$. Then, the control signal $t_i$ rises and the switches SW1 through SW4 are turned on. As a result, the data $D_1$ through $D_4$ are latched to the latch circuits L1 through L4, respectively, which compose the first latch circuit group.

Thereafter, the control signals $t_2$ and $t_1$ rise alternately every 1 clock and the data $D_5$ through $D_8$ are latched to the latch circuits L5 through L8, respectively, which compose the second latch circuit group, and the data $D_9$ and $D_{12}$ are latched to the latch circuits L1 through L4, respectively, and the data read out from the memory cell array is alternately latched to the latch circuit groups alternately by 4 bits each.

On the other hand, on the output side of the latch circuits L1 through L8, the control signals $t_A$, $t_B$, $t_C$, $t_D$, $t_E$, $t_F$, $t_G$, and $t_H$ rise successively every ¼ clock of the external clock CLK. The control signal $t_x$ becomes active in the same timing as that of the control signals $t_A$, $t_C$, $t_E$, and $t_G$, and the control signal $t_y$ becomes active in the same timing as that of the control signals $t_B$, $t_D$, $t_F$, and $t_H$. It should be noted that the control signal $t_A$ becomes active more than 1 clock faster than the data bit $D_9$ is latched. If the control signal $t_A$ becomes active in timing slower than that, the data will be destroyed because at least the data bit $D_4$ is not output in timing when the data bits $D_9$ through $D_{12}$ are latched.

In this way, according to the present embodiment, even when the length of one cycle of the control signals $t_x$ and $t_y$ is brought to correspond to ½ clock of the external clock CLK, 4-bit data input in parallel can be output successively in serial. Consequently, activation and deactivation control of the control signals $t_x$ and $t_y$ becomes easy and a wide margin is able to be secured. For example, if one clock is 10 nsec, activation and deactivation control can be made every 2.5 nsec.

In the operation shown in FIG. 8, the period during which the control signals $t_A$ through $t_H$ are held high is ¼ clock of the external clock CLK, but this period may be set to ½ clock and the duty ratio may be 50%. That is because even if, for example, both the control signals $t_A$ and $t_B$ are high, the control signals $t_x$ and $t_y$ are exclusively switched, and the output ends of the latch circuits L1 and L2 will not become connecting simultaneously to the output terminal OUT. In this way, by bringing the duty ratio of control signals $t_A$ through $t_H$ to 50%, these activation and deactivation margins can be further widened. For example, if 1 clock is 10 nsec, activation and deactivation control can be made every 5 nsec.

In the second embodiment, the period during which the data are latched to the latch circuits L1 through L8 is set to about 2 clocks of the external clock CLK and the eight latch circuits are provided, but when the period during which the data are latched is set longer, more latch circuits are required, as in the case of the first embodiment.

In the second embodiment, the control signals $t_H$ and $t_y$ are different signals from each other, but these may be generated from one signal. Furthermore, between the memory cell array and the logical circuit according to the second embodiment, a multiplexer may be provided for selecting which input bit line BL1 through BL4 should be used for carrying the data read out.

The first and the second embodiments are intended for serializing and outputting 2-bit and 4-bit data simultaneously read out, respectively, but the present invention may be applied to cases in which 8-bit, 16-bit, ... data simultaneously read out are serialized and output.

In the first and the second embodiments, a plurality of latch circuits are defined into two latch circuit groups, but may be defined into four latch circuit groups or more groups. When the external clock frequency becomes high, the configuration of the output circuit will become complicated, but it is advantageous in that the margin of each control signal is secured to define latch circuits to more groups.

Furthermore, in the first and the second embodiment, it has been explained that the control signal of the switches connected to the output ends of the latch circuits is in synchronism with the control signal in the output circuit. In fact, however, a moderate delay may occur in signal propagation, and therefore, it is preferable to make a design delay in consideration of delay of control signals in the output circuit.

In general, to simultaneously read out memory, there are two methods: one called sequential readout and the other interleave readout. Tables 1 through 3 below show the read-out order in each reading out method. In Tables 1 through 3, the start address is shown with the binary number system and the readout order is shown with the decimal number system.

TABLE 1

| Start address | Sequential readout | Interleave readout |
|---|---|---|
| 0 | 0, 1 | 0, 1 |
| 1 | 1, 0 | 1, 0 |

TABLE 2

| Start address | Sequential readout | Interleave readout |
|---|---|---|
| 00 | 0, 1, 2, 3 | 0, 1, 2, 3 |
| 01 | 1, 2, 3, 0 | 1, 0, 3, 2 |
| 10 | 2, 3, 0, 1 | 2, 3, 0, 1 |
| 11 | 3, 0, 1, 2 | 3, 2, 1, 0 |

TABLE 3

| Start address | Sequential readout | Interleave readout |
|---|---|---|
| 00 | 0, 1, 2, 3, 4, 5, 6, 7 | 0, 1, 2, 3, 4, 5, 6, 7 |
| 001 | 1, 2, 3, 4, 5, 6, 7, 0 | 1, 0, 3, 2, 5, 4, 7, 6 |
| 010 | 2, 3, 4, 5, 6, 7, 0, 1 | 2, 3, 0, 1, 6, 7, 5, 4 |
| 011 | 3, 4, 5, 6, 7, 0, 1, 2 | 3, 2, 1, 0, 7, 6, 5, 4 |
| 100 | 4, 5, 6, 7, 0, 1, 2, 3 | 4, 5, 6, 7, 0, 1, 2, 3 |
| 101 | 5, 6, 7, 0, 1, 2, 3, 4 | 5, 4, 7, 6, 1, 0, 3, 2 |
| 110 | 6, 7, 0, 1, 2, 3, 4, 5 | 6, 7, 4, 5, 2, 3, 0, 1 |
| 111 | 7, 0, 1, 2, 3, 4, 5, 6 | 7, 6, 5, 4, 3, 2, 1, 0 |

The present invention may be applied to all of the two readout methods.

What is claimed is:

1. A logical circuit comprising:
   even input bit lines;
   a first latch circuit group which comprises a plurality of latch circuits which simultaneously latch a plurality of signal bits propagating said even input bit lines, respectively, in a first timing;
   a second latch circuit group which comprises a plurality of latch circuits which simultaneously latch a plurality of signal bits propagating said even input bit lines, respectively, in a second timing;
   a first node to which the output ends of a plurality of latch circuits are wired-OR, said plurality of latch circuits latching signal bits which propagate one half of said even input bit lines;
   a second node to which the output ends of a plurality of latch circuits are wired-OR, said plurality of latch circuits latching signal bits which propagate remaining one half of said even input bit lines;
   a third node to which said first and the second nodes are wired-OR;
   a first control system, said first control system successively outputting signal bits latched to one latch circuit group of said first and second latch circuit groups to said first node and then successively outputting signal bits latched to the other latch circuit group to said second node before latching the next signal bits; and
   a second control system which alternately outputs signal bits successively inputted to said first and second nodes from said first and second nodes to said third node.

2. The logical circuit according to claim 1 wherein said first control system comprises;
   a plurality of first switching elements respectively provided between said first node and the output ends of said plurality of latch Circuits latching signal bits which propagate said one half of said even input bit lines; and
   a plurality of second switching elements respectively provided between said second node and the output ends of said plurality of latch circuits latching signal bits which propagate said remaining one half of said even input bit lines.

3. The logical circuit according to claim 1 wherein said second control system exclusively controls connection/disconnection between said first node and said third node and connection/disconnection between said second node and said third node.

4. The logical circuit according to claim 2 wherein said second control system exclusively controls connection/disconnection between said first node and said third node and connection/disconnection between said second node and said third node.

5. The logical circuit according to claim 3 wherein said second control system controls connection/disconnection with synchronization with both edges of rise and fall of a pulse signal which periodically change.

6. The logical circuit according to claim 4 wherein said second control system controls connection/disconnection with synchronization with both edges of rise and fall of a pulse signal which periodically change.

7. The logical circuit according to claim 1 wherein said even input bit lines are connected to a multiplexer, said multiplexer is provided between said first and second latch circuit groups and a memory cell array, said signal bits being simultaneously read out for each plural bits from said memory cell array, and said multiplexer selects input bit lines to which said signal bits are outputted in relation to an address in said memory cell array.

8. The logical circuit according to claim 2 wherein said even input bit lines are connected to a multiplexer, said multiplexer is provided between said first and second latch circuit groups and a memory cell array, said signal bits being simultaneously read out for each plural bits from said memory cell array, and said multiplexer selects input bit lines to which said signal bits are outputted in relation to an address in said memory cell array.

9. The logical circuit according to claim 3 wherein said even input bit lines are connected to a multiplexer, said multiplexer is provided between said first and second latch circuit groups and a memory cell array, said signal bits being simultaneously read out for each plural bits from said memory cell array, and said multiplexer selects input bit lines to which said signal bits are outputted in relation to an address in said memory cell array.

10. The logical circuit according to claim 4 wherein said even input bit lines are connected to a multiplexer, said multiplexer is provided between said first and second latch circuit groups and a memory cell array, said signal bits being simultaneously read out for each plural bits from said memory cell array, and said multiplexer selects input bit lines to which said signal bits are outputted in relation to an address in said memory cell array.

11. The logical circuit according to claim 5 wherein said even input bit lines are connected to a multiplexer, said multiplexer is provided between said first and second latch circuit groups and a memory cell array, said signal bits being simultaneously read out for each plural bits from said memory cell array, and said multiplexer selects input bit lines to which said signal bits are outputted in relation to an address in said memory cell array.

12. The logical circuit according to claim 6 wherein said even input bit lines are connected to a multiplexer, said multiplexer is provided between said first and second latch circuit groups and a memory cell array, said signal bits being simultaneously read out for each plural bits from said memory cell array, and said multiplexer selects input bit lines to which said signal bits are outputted in relation to an address in said memory cell array.

* * * * *